(12) United States Patent
Murai et al.

(10) Patent No.: US 9,728,700 B2
(45) Date of Patent: Aug. 8, 2017

(54) PHONON SCATTERING MATERIAL, NANOCOMPOSITE THERMOELECTRIC MATERIAL, AND METHOD OF PRODUCING THE SAME

(71) Applicants: TOYOTA JIDOSHA KABUSHIKI KAISHA, Toyota-shi, Aichi-ken (JP); Admatechs Company Limited, Miyoshi-shi, Aichi (JP)

(72) Inventors: Junya Murai, Nissin (JP); Tomonari Kogure, Toyota (JP); Youichiro Kawai, Okazaki (JP); Tomoharu Kataoka, Miyoshi (JP); Yoshinori Okawauchi, Nagoya (JP)

(73) Assignees: TOYOTA JIDOSHA KABUSHIKI KAISHA, Toyota (JP); ADMATECHS COMPANY LIMITED, Miyoshi (JP)

( * ) Notice: Subject to any disclaimer, the term of this patent is extended or adjusted under 35 U.S.C. 154(b) by 63 days.

(21) Appl. No.: 14/668,428

(22) Filed: Mar. 25, 2015

(65) Prior Publication Data
US 2015/0280096 A1 Oct. 1, 2015

(30) Foreign Application Priority Data

Mar. 28, 2014 (JP) .................... 2014-068975
Mar. 10, 2015 (JP) .................... 2015-047727

(51) Int. Cl.
*H01L 35/14* (2006.01)
*C08L 83/04* (2006.01)
*H01L 35/24* (2006.01)

(52) U.S. Cl.
CPC .................... *H01L 35/24* (2013.01)

(58) Field of Classification Search
CPC ....................................... H01L 35/12
See application file for complete search history.

(56) References Cited

U.S. PATENT DOCUMENTS 3,419,593 A * 12/1968 Willing ............... B01J 31/1608
502/158
4,153,641 A * 5/1979 Deichert ............... C08G 77/20
264/1.38

(Continued)

FOREIGN PATENT DOCUMENTS

JP 2010114419 A 5/2010
JP 2011249749 A 12/2011
(Continued)

*Primary Examiner* — Carol M Koslow
(74) *Attorney, Agent, or Firm* — Oliff PLC

(57) ABSTRACT

Provided is a compound which is mixed with a thermoelectric conversion material matrix as a phonon scattering material. The compound is represented by the following formula:

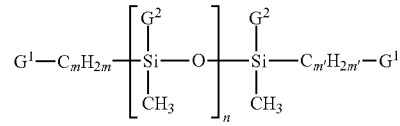

(In the above formula, $G^1$ represents a functional group capable of binding to the thermoelectric conversion material matrix; $G^2$ independently represents $G^1$ or $CH_3$; $0 \leq m \leq 5$; $0 \leq m' \leq 5$; $6 \leq n \leq 1000$; and $1/1000 < $(the number of $G^1/n) \leq 1$).

3 Claims, 5 Drawing Sheets

(56) References Cited

U.S. PATENT DOCUMENTS

| | | | | |
|---|---|---|---|---|
| 5,206,328 A | * | 4/1993 | Okamura | C08G 77/10 528/14 |
| 5,206,337 A | * | 4/1993 | Takeda | C08G 77/455 528/313 |
| 2011/0198541 A1 | | 8/2011 | Murai et al. | |
| 2011/0284804 A1 | | 11/2011 | Kim et al. | |
| 2013/0240775 A1 | | 9/2013 | Kita et al. | |
| 2014/0174493 A1 | | 6/2014 | Murai et al. | |

FOREIGN PATENT DOCUMENTS

| JP | 2013041916 A | 2/2013 |
|---|---|---|
| JP | 2013197583 A | 9/2013 |

\* cited by examiner

PHONON SCATTERING MATERIAL, NANOCOMPOSITE THERMOELECTRIC MATERIAL, AND METHOD OF PRODUCING THE SAME

INCORPORATION BY REFERENCE

The disclosures of Japanese Patent Application No. 2014-068975 filed on Mar. 28, 2014 and Japanese Patent Application No. 2015-047727 filed on Mar. 10, 2015 including the specification, drawings and abstract are incorporated herein by reference in its entirety.

BACKGROUND OF THE INVENTION

1. Field of the Invention

The present invention relates to a compound which is dispersed in a thermoelectric conversion material matrix as a phonon scattering material, a nanocomposite thermoelectric material including this compound, and a method of producing the same.

2. Description of Related Art

Recently, in order to reduce carbon dioxide emission in regard to global warming, techniques of reducing the ratio of energy obtained from fossil fuel have increasingly attracted attention. For example, one of the techniques is a technique of using a thermoelectric conversion material which can directly convert unused waste heat energy into electrical energy. The thermoelectric conversion material refers to a material which can directly convert heat into electrical energy without the necessity of a two-step process unlike thermal power generation, the two-step process including: a step of converting heat into kinetic energy; and a step of converting the kinetic energy into electrical energy.

The conversion from heat into electrical energy is performed using a difference in temperature between opposite ends of a bulk body which is formed from the thermoelectric conversion material. A phenomenon in which voltage is generated due to this difference in temperature was discovered by Seebeck and thus is called the Seebeck effect.

The performance of the thermoelectric conversion material is represented by a performance index ZT obtained from the following equation.

$$ZT = \alpha^2 \sigma T / \kappa (= Pf \cdot T / \kappa)$$

In the equation, $\alpha$ represents the Seebeck coefficient of the thermoelectric conversion material, $\sigma$ represents the electrical conductivity of the thermoelectric conversion material, and $\kappa$ represents the thermal conductivity of the thermoelectric conversion material. The term $\alpha^2 \sigma$ is collectively referred to as an output factor Pf. Z has a dimension that is an inverse of temperature. ZT, which is obtained by multiplying this performance index Z by an absolute temperature T, is a dimensionless value. ZT is referred to as "dimensionless performance index" and is used as an index indicating the performance of the thermoelectric conversion material.

In order for the thermoelectric conversion material to be widely used, this performance is required to be further improved. For the improvement of the performance of the thermoelectric conversion material, as clearly seen from the above-described equation, it is necessary to increase the Seebeck coefficient $\alpha$ and the electrical conductivity $\sigma$ and to reduce the thermal conductivity $\kappa$.

However, it is difficult to improve all the properties at the same time, and many attempts have been made to improve any one of the properties of the thermoelectric conversion material.

For example, Japanese Patent Application Publication No. 2010-114419 (JP 2010-114419 A) discloses a technique of reducing the thermal conductivity by dispersing nanoparticles of ceramic or the like having an average particle size of 1 nm to 100 nm in a thermoelectric conversion material matrix as phonon-scattering particles so as to scatter phonons which are one of the factors for thermal conduction.

In the above-described thermoelectric conversion material, phonons are scattered at interfaces between the phonon-scattering particles. However, since the phonon-scattering particles are in the form of a particle, the phonon-scattering interfacial area is insufficient.

SUMMARY OF THE INVENTION

The invention has been made to provide a compound having a sufficient phonon-scattering interfacial area, a nanocomposite thermoelectric material including this compound, and a method of producing the same.

According to a first aspect of the invention, there is provided a compound which is mixed with a thermoelectric conversion material matrix as a phonon scattering material. This compound is represented by the following formula.

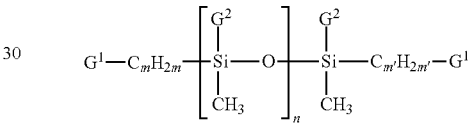

(In the above formula, $G^1$ represents a functional group capable of binding to the thermoelectric conversion material matrix; $G^2$ independently represents $G^1$ or $CH_3$; $0 \leq m \leq 5$; $0 \leq m' \leq 5$; $6 \leq n \leq 1000$; and $1/1000 < $ (the number of $G^1/n) \leq 1$).

In addition, according to a second aspect of the invention, there is provided a nanocomposite thermoelectric material. The nanocomposite thermoelectric material includes a thermoelectric conversion material matrix and the above-described compound as a phonon scattering material. The compound binds to the thermoelectric conversion material matrix through the functional group $G^1$.

Further, according to a third aspect of the invention, there is provided a method of producing a nanocomposite thermoelectric material. This method includes forming nanoparticles of constituent elements of the thermoelectric conversion materials by mixing a reducing agent with a solution of a salt of a source material of a thermoelectric conversion material; forming a slurry of the nanoparticles and the above-described compound; stirring and aging this mixture; and performing a hydrothermal treatment on the mixture.

According to the above-described aspects of the invention, the compound which is the phonon scattering material binds to the thermoelectric conversion material matrix. Accordingly, a fine and complex structure is formed at an interface between the thermoelectric conversion material matrix and the phonon scattering material, and thus the interfacial area increases. As a result, since phonons are scattered at the interface, the thermal conductivity (lattice thermal conductivity) affected by the phonons decreases.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

A compound according to an embodiment of the invention is a compound which is mixed with a thermoelectric conversion material matrix as a phonon scattering material, the compound being represented by the following formula.

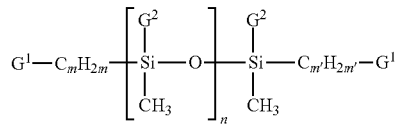

In the compound, $G^1$ represents a functional group capable of binding to the thermoelectric conversion material matrix and, specifically, represents a group selected from the group consisting of a mercapto group, a carboxyl group, an amino group, a vinyl group, an epoxy group, a styryl group, a methacryl group, an acryl group, an isocyanurate group, a ureido group, a sulfide group, an isocyanate group, and mixtures thereof. In addition, $G^2$ independently represents the functional group $G^1$ or $CH_3$.

The size (molecular length) of this compound can be controlled by adjusting the number of Si, that is, n, m and m'. When $0 \leq m \leq 5$, $0 \leq m' \leq 5$ and $6 \leq n \leq 1000$ the size, that is, the molecular length can be controlled to be 0.3 nm to 5 nm. Here, m is preferably zero and m' is preferably zero In the compound, in order to improve the binding to the thermoelectric conversion material matrix, the number of the functional group $G^1$ satisfies $1/1000 < $(the number of $G^1/n) \leq 1$.

Figure 1:
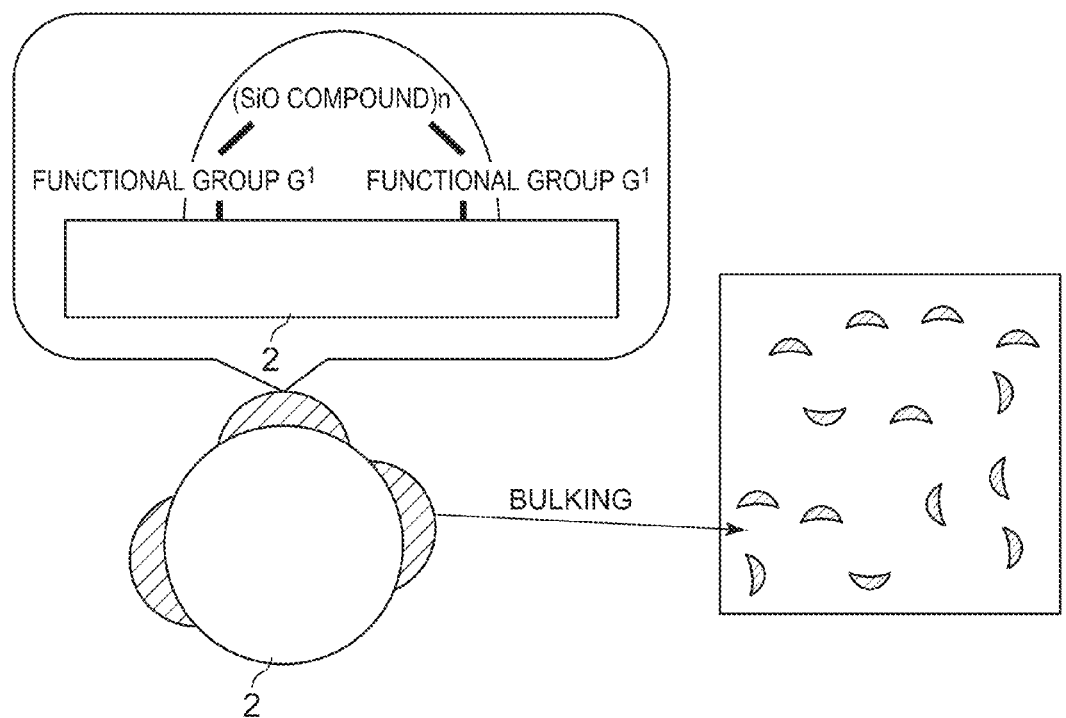
FIG. 1 is a schematic diagram illustrating a nanocomposite thermoelectric material according to an embodiment of the invention.

In the nanocomposite thermoelectric material according to the invention, as schematically illustrated in FIG. 1, the compound binds to a surface of a thermoelectric conversion raw material particle 2 through the functional group $G^1$.

The thermoelectric conversion material constituting the particle 2 may be P-type or N-type. A source material of a P-type thermoelectric conversion material is not particularly limited, and examples thereof include $Bi_2Te_3$-based compounds, PbTe-based compounds, $Zn_4Sb_3$-based compounds, $CoSb_3$-based compounds, half-Heusler compounds, full-Heusler compounds, and SiGe-based compounds. As a source material of a N-type thermoelectric conversion material, a well-known material can be used without any particular limitation, and examples thereof include $Bi_2Te_3$-based compounds, PbTe-based compounds, $Zn_4Sb_3$-based compounds, $CoSb_3$-based compounds, half-Heusler compounds, full-Heusler compounds, SiGe-based compounds, $Mg_2Si$-based compounds, $Mg_2Sn$-based compounds, and CoSi-based compounds. Among these, a thermoelectric conversion material is preferably used which is generally known as a high-performance material and is selected from $(Bi,Sb)_2(Te,Se)_3$-based compounds, $CoSb_3$-based compounds, PbTe-based compounds, and SiGe-based compounds.

In the nanocomposite thermoelectric conversion material, in order to exhibit a predetermined effect, a volume fraction of the compound as a phonon scattering material is preferably 0.1 vol % to 20 vol % and more preferably 0.2 vol % to 10 vol %. In the compound which binds to the thermoelectric conversion material matrix, a group other than the functional group which binds to the thermoelectric conversion material matrix is an inert methyl group. The compounds do not polymerize by condensation. When the functional group binds to the thermoelectric conversion material matrix, a sufficient phonon-scattering interfacial area can be provided between the matrix and the compound. Accordingly, a sufficient phonon-scattering effect can be achieved by using the compound according to the invention in a smaller amount as compared to a nanocomposite thermoelectric material to which phonon-scattering particles having the form of a particle are added.

A nanocomposite thermoelectric material according to the embodiment of the invention can be produced by precipitating thermoelectric conversion material matrix particles by reduction using a general method, adding the compound as a phonon scattering material to a slurry including these particles, and binding the compound to the thermoelectric conversion material matrix particles to form an alloy.

Specifically, first, nanoparticles of constituent elements of the thermoelectric conversion material are synthesized. Preferably, this process is performed by reducing a salt of each constituent element in a solution. As the salt of each constituent element, a chloride such as bismuth chloride, tellurium chloride, or selenium chloride is preferably used. This reduction is performed by adding a solution including a reducing agent dropwise to an alcohol solution including the salts of the constituent elements of the thermoelectric conversion material. The alcohol which is the solvent of the dispersion is not particularly limited as long as the salts of the constituent elements of the thermoelectric conversion material can be dispersed therein, but ethanol is preferably used. In addition, optionally, a pH adjuster may be added. The pH adjuster is used to inhibit the particles and the like from aggregating in the slurry. As the pH adjuster, a well-known one can be appropriately used, and examples thereof include hydrochloric acid, acetic acid, nitric acid, ammonia water, sodium hydroxide, and sodium borohydride ($NaBH_4$).

The pH of the dispersion is adjusted to be preferably 3 to 6 or 8 to 11 and more preferably 4 to 6 or 8 to 10. After adjusting the dispersion in this way, a solution including a reducing agent is added dropwise to the dispersion. The reducing agent is not particularly limited as long as ions of the constituent elements of the thermoelectric conversion material can be reduced, and examples thereof include $NaBH_4$ and hydrazine.

In the dispersion including the salts of the constituent elements of the thermoelectric conversion material, ions of the source materials of the thermoelectric conversion material, for example, Bi ions and Te ions are present. Accordingly, once the solution including the reducing agent is mixed with the dispersion, these ions are reduced, for example, as shown in the following formula. Therefore, particles of the constituent elements of the thermoelectric conversion material, for example, Bi particles and Te particles are precipitated.

$$BiCl_3 + NaBH_4 + H_2O \rightarrow Bi + NaCl + H_3BO_3 + H_2$$

Due to this reduction, in addition to Bi particles and Te particles, by-products such as NaCl and NaBO$_3$ are produced. In order to remove these by-products, filtration is preferably performed. Further, after the filtration, alcohol or water is preferably added to wash the by-products away.

The compound according to the invention is added to the slurry including the nanoparticles of the constituent elements of the thermoelectric conversion material, followed by stirring and aging for 1 hour to 48 hours. As a result, the functional group G$^1$ of the compound according to the invention binds to the surfaces of the nanoparticles of the constituent elements of the thermoelectric conversion material.

An alloy is formed by performing a hydrothermal treatment on the nanoparticles of each constituent element having a surface to which the phonon scattering material binds as described above, and nanoparticles of the thermoelectric conversion material are produced. This hydrothermal treatment is performed by heating the nanoparticles of each constituent element, typically, in an autoclave at a temperature sufficient for forming the alloy, for example, at 240° C. for 48 hours. Due to the hydrothermal treatment, the particles of the constituent elements of the thermoelectric conversion material, for example, Bi particles and Te particles form an alloy, and thermoelectric conversion material particles are formed.

Finally, the thermoelectric conversion material particles in which the compound of the invention is dispersed are sintered. As a result, a thermoelectric conversion material as a bulk body is obtained (FIG. 1). The compound according to the invention is in a state of being dispersed in the thermoelectric conversion material matrix as a phonon scattering material having a size of 0.3 nm to 5 nm.

EXAMPLES

Example 1

According to the following procedure and conditions, a nanocomposite thermoelectric conversion material in which phonon-scattering particles bind to a thermoelectric conversion material matrix (Bi,Sb)$_2$Te$_3$ was produced.

As salts of constituent elements of the thermoelectric conversion material matrix, chlorides including BiCl$_3$ (0.24 g), TeCl$_4$ (1.51 g), and SbCl$_3$ (0.68 g) were dissolved in 150 mL of ethanol to prepare a thermoelectric source material solution. As a reducing agent, sodium borohydride (NaBH4; 1.60 g) was added to 150 mL of ethanol, and this reducing agent solution was added dropwise to the thermoelectric source material solution to precipitate nanoparticles of Bi, Te, and Sb which are the constituent elements of the thermoelectric conversion material matrix.

A compound (particle size: 1.3 nm) represented by the following formula was added to the obtained ethanol slurry including the nanoparticles as phonon-scattering particles such that a volume fraction thereof was 0.4 vol % or 6.0 vol %, followed by stirring and aging for 58 hours. As a result, this compound bound to the nanoparticles of Bi, Te, and Sb.

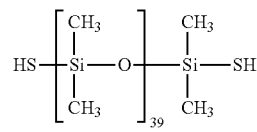

The obtained ethanol slurry including the nanoparticles was washed and filtered with water and then was washed and filtered with ethanol. Next, the slurry was put into a sealed autoclave, and a hydrothermal treatment was performed thereon at 240° C. for 48 hours to form an alloy. Next, the alloy was dried in a nitrogen gas flow atmosphere, and powder of a BiSbTe-based alloy to which the phonon-scattering particles represented by the above formula bound was collected. Finally, this powder was SPS-sintered at 360° C., and a bulk body of a nanocomposite thermoelectric conversion material was prepared.

Figure 2:
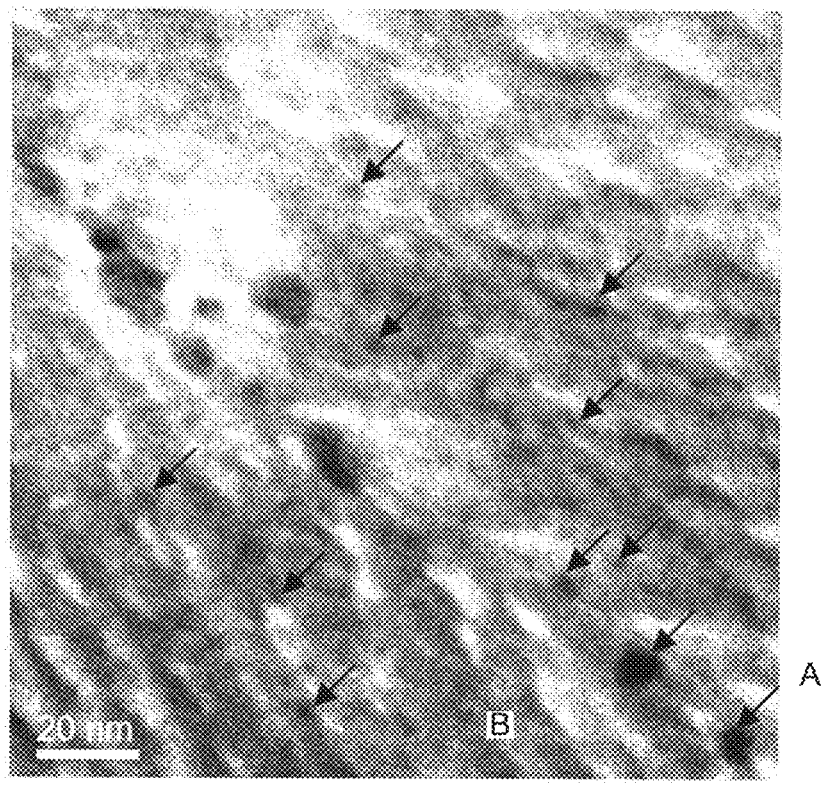
FIG. 2 is a high-resolution STEM image of a bulk body which was obtained in an example of the invention.

FIG. 2 illustrates the result of high-resolution STEM observation of the obtained bulk body. It was confirmed that the fine phonon scattering material was dispersed, and the results of STEM-EDX quantitative analysis at points A and B are shown in the following table.

TABLE 1

|         | S   | Si   | O    | Sb   | Te   | Bi   |
|---------|-----|------|------|------|------|------|
| Point A | 1.9 | 38.9 | 38.3 | 3.3  | 11.0 | 6.6  |
| Point B | 0.0 | 0.0  | 0.0  | 27.2 | 59.4 | 13.4 |

The number of functional groups at point A/Si was 1.9/38.9, that is, 0.049.

Example 2

A bulk body of a nanocomposite thermoelectric conversion material was prepared with the same method as that of Example 1, except that a compound represented by the following formula was used as the phonon-scattering particles.

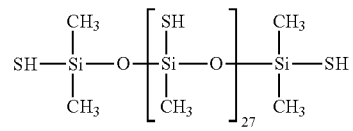

As in the case of Example 1, the compound was added such that a volume fraction thereof was 0.4 vol % or 6.0 vol %.

Comparative Example 1

BiCl$_3$ (0.24 g), TeCl$_4$ (1.51 g), and SbCl$_3$ (0.68 g) were dissolved in 100 mL of 2-propanol to prepare a thermoelectric source material solution (first solution). TEOS (0.14 g) was dissolved in 100 mL of 2-propanol to prepare a second solution. In addition, sodium borohydride (NaBH$_4$; 1.59 g) as a reducing agent was dissolved in 100 mL of 2-propanol to prepare a solution (reducing agent solution).

The reducing agent solution was added dropwise to the first solution to precipitate nanoparticles of Bi, Te, and Sb, and the second solution was added thereto to precipitate SiO$_2$. At this time, it is considered that, since the precipitation rates of Bi, Te, and Sb were higher than that of SiO$_2$, the nanoparticles of Bi, Te, and Sb were precipitated and grown into spherical nanoparticles first, and then nanoparticles of SiO2 were grown in an arc shape on the surfaces of the nanoparticles of Bi, Te, and Sb or at gaps between the nanoparticles of Bi, Te, and Sb.

The obtained slurry of 2-propanol was washed and filtered with water and then was washed and filtered with 2-propanol. Next, the slurry was put into a sealed autoclave, and a hydrothermal treatment was performed thereon at 240° C. for 48 hours to form an alloy. Next, the alloy was dried in a nitrogen gas flow atmosphere, and powder of nanocomposite particles including the BiSbTe-based alloy nanoparticles and the $SiO_2$ nanoparticles was collected. Finally, this powder was SPS-sintered at 360° C., and a bulk body of a nanocomposite thermoelectric conversion material was prepared.

Comparative Example 2

$BiCl_3$ (0.24 g), $TeCl_4$ (1.51 g), and $SbCl_3$ (0.68 g) were dissolved in 100 mL of ethanol, and a commercially available product of $SiO_2$ (particle size: 5 nm) was added thereto in 5 vol %, 13 vol %, or 20 vol % to prepare a slurry. A solution in which sodium borohydride ($NaBH_4$; 1.59 g) as a reducing agent was dissolved in 100 mL of ethanol was added dropwise to the slurry to obtain a mixture of nanoparticles of Bi, Te, and Sb and nanoparticles of $SiO_2$. Next, the mixture was put into a sealed autoclave, and a hydrothermal treatment was performed thereon at 240° C. for 48 hours to form an alloy. Next, the alloy was dried in a nitrogen gas flow atmosphere, and powder of nanocomposite particles including the BiSbTe-based alloy nanoparticles and the $SiO_2$ nanoparticles was collected. Finally, this powder was SPS-sintered at 360° C., and a bulk body of a nanocomposite thermoelectric conversion material in which $SiO_2$ nanoparticles were dispersed was prepared.

Comparative Example 3

A bulk body of a nanocomposite thermoelectric conversion material in which $SiO_2$ nanoparticles were dispersed was prepared with the same method as that of Comparative Example 2, except that $SiO_2$ (particle size: 15 nm) was added in 10 vol % or 20 vol % instead of $SiO_2$ (particle size: 5 nm).

Figure 3:
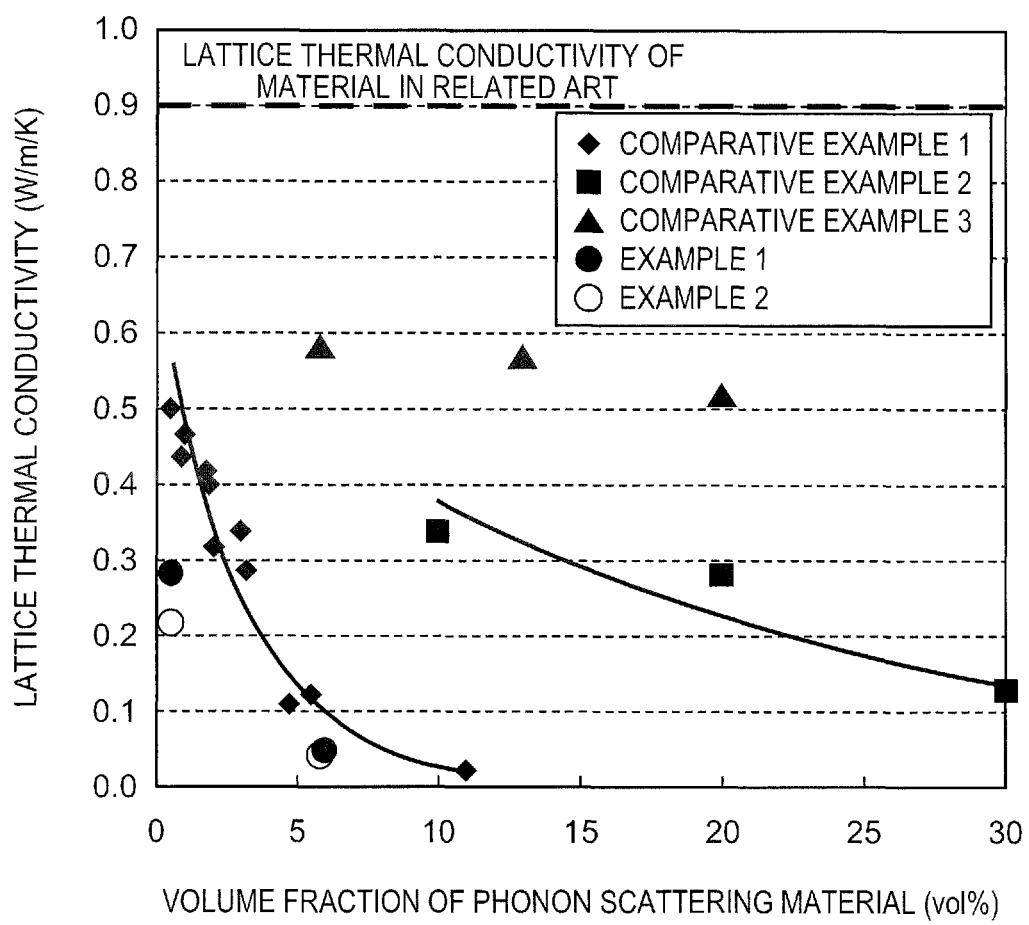
FIG. 3 is a graph illustrating a lattice thermal conductivity of a nanocomposite thermoelectric conversion material with respect to a volume fraction of a phonon scattering material.
Figure 4:
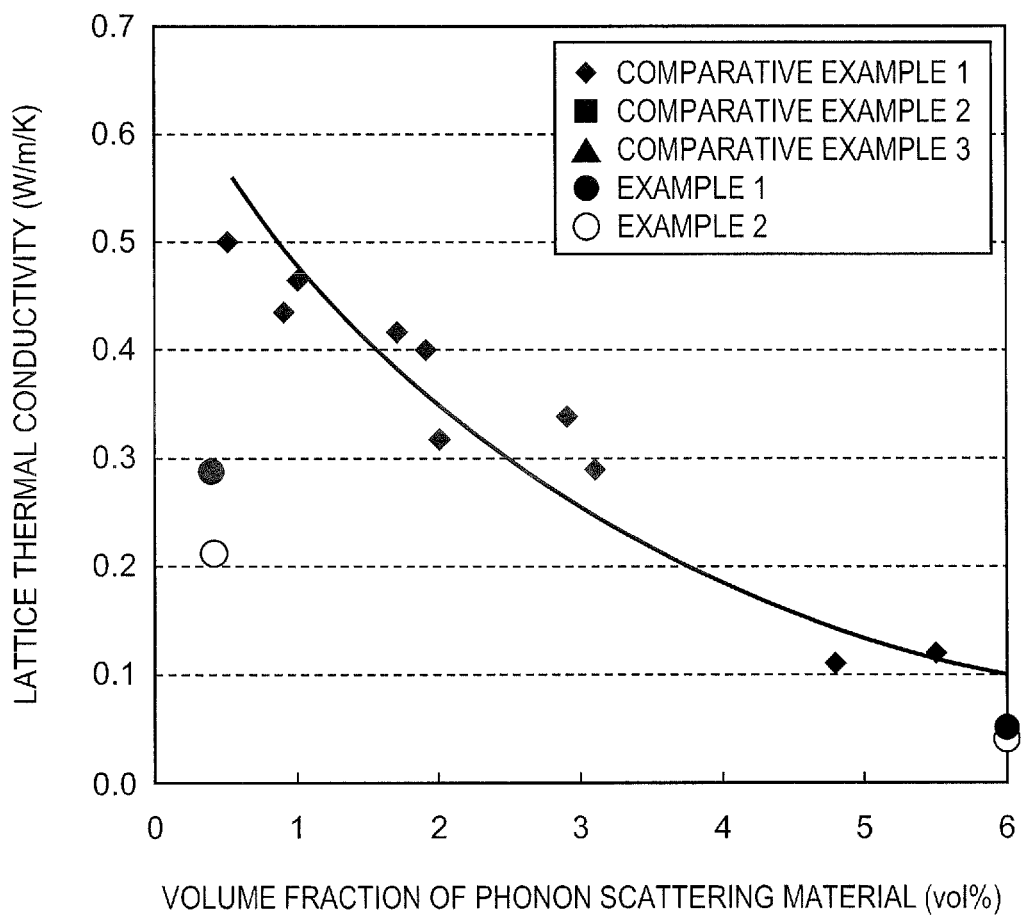
FIG. 4 is a graph illustrating a lattice thermal conductivity of a nanocomposite thermoelectric conversion material with respect to a volume fraction of a phonon scattering material.
Figure 5:
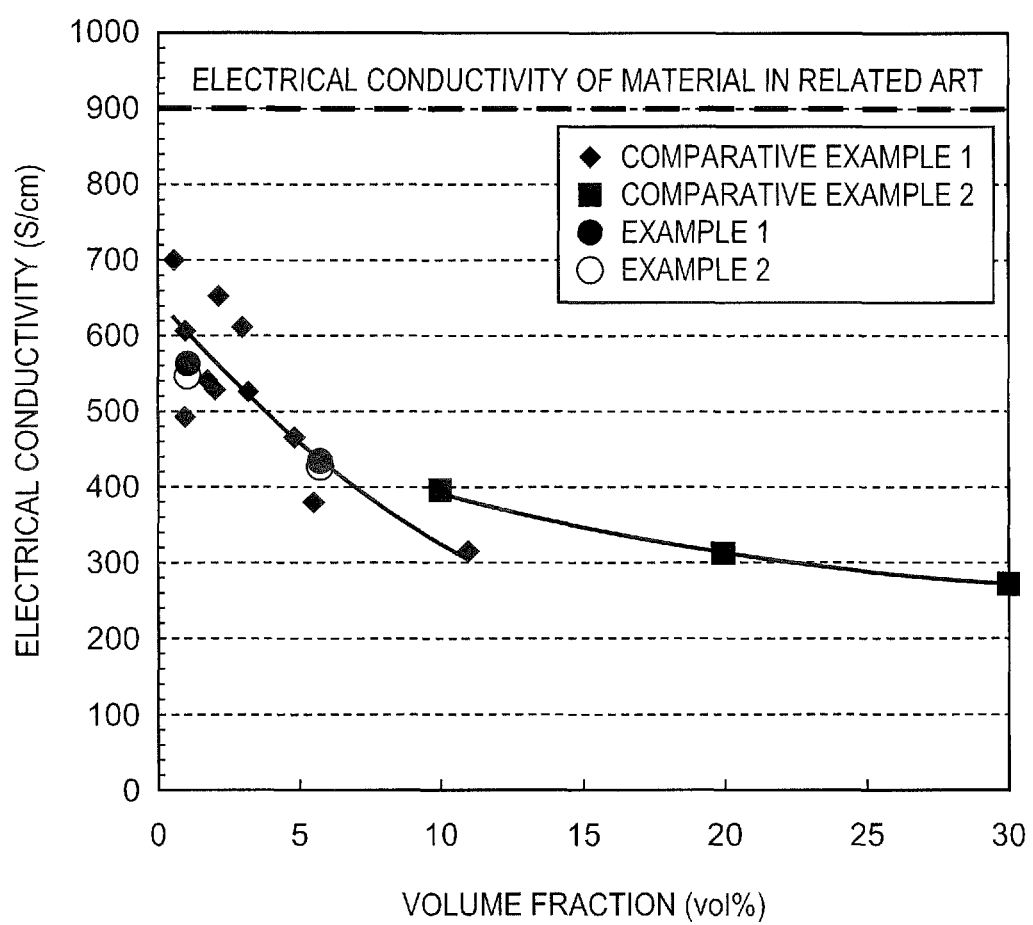
FIG. 5 is a graph illustrating an electrical conductivity of a nanocomposite thermoelectric conversion material with respect to a volume fraction of a phonon scattering material.

FIGS. 3 to 5 illustrate relationships between the respective properties of the nanocomposite thermoelectric conversion material and the volume fraction of the phonon scattering material regarding Examples according to the invention and Comparative Examples.

In FIGS. 3 and 4, the lattice thermal conductivity is plotted with respect to the volume fraction of the phonon scattering material. In the upper section of the drawing, the horizontal broken line represents the lattice thermal conductivity of a BiSbTe-based thermoelectric conversion material not including a phonon scattering material, which is 0.90 W/m/K. In Comparative Examples 2 and 3 in which spherical $SiO_2$ particles as a phonon scattering material were added to the BiSbTe-based thermoelectric conversion material matrix, a significant decrease in the lattice thermal conductivity was observed at a volume fraction of 5 vol % or greater. In addition, in Comparative Example 1 in which $SiO_2$ was precipitated on the thermoelectric conversion material matrix, a significant decrease in the lattice thermal conductivity was observed at a volume fraction of 0.5 vol % or greater. On the other hand, in Examples 1 and 2 according to the invention in which the predetermined compound bound to the surface of the thermoelectric conversion material matrix, the lattice thermal conductivity was further decreased even with a small amount of the phonon scattering material which was a volume fraction of 0.5 vol %.

Next, in FIG. 5, the electrical conductivity is plotted with respect to the volume fraction of the phonon scattering material. In the upper section of the drawing, the horizontal broken line represents the electrical conductivity of a BiSbTe-based thermoelectric conversion material not including a phonon scattering material, which is 900 S/cm. In Comparative Example 2 in which spherical $SiO_2$ particles as a phonon scattering material were added to the BiSbTe-based thermoelectric conversion material matrix, a significant decrease in the electrical conductivity was observed at a volume fraction of 10 vol % or greater. In addition, in Comparative Example 1 in which $SiO_2$ was precipitated on the thermoelectric conversion material matrix, a significant decrease in the electrical conductivity according to the rule of mixtures was observed along with an increase in the volume fraction of the phonon scattering material. On the other hand, in Examples 1 and 2 according to the invention in which the predetermined compound bound to the surface of the thermoelectric conversion material matrix, the above-described tendencies were shown.

What is claimed is:
1. A nanocomposite thermoelectric material comprising:
a thermoelectric conversion material bulk body; and
compounds dispersed in the nanocomposite thermoelectric material as a phonon scattering material, wherein the compounds are represented by the following formula:

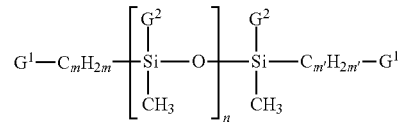

wherein:
$G^1$ represents a functional group selected from the group consisting of a mercapto group, a carboxyl group, an amino group, an epoxy group, a styryl group, a methacryl group, an acryl group, an isocyanurate group. a ureido group, a sulfide group, an isocyanate group, and mixtures thereof;
$G^2$ independently represents $G^1$ or $CH_3$;
$0 \leq m \leq 5$;
$0 \leq m' \leq 5$;
$6 \leq n \leq 1000$; and
$1/1000 < $(the number of $G^1$/n)$\leq 1$.
2. The nanocomposite thermoelectric material according to claim 1, wherein a volume fraction of the compounds is 0.1 vol % to 20 vol %.
3. A method of producing a nanocomposite thermoelectric material comprising:
mixing a reducing agent with a solution of a salt of a source material of a thermoelectric conversion material to form particles of constituent elements of the thermoelectric conversion material;
mixing a compound with a slurry including the particles of the constituent elements of the thermoelectric conversion material, wherein the compound is represented by the following formula:

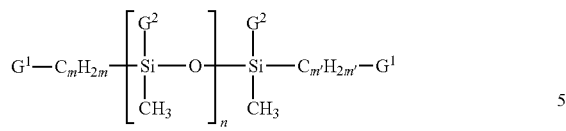

wherein:

$G^1$ represents a functional group selected from the group consisting of a mercapto group, a carboxyl group, an amino group, an epoxy group, a styryl group, a methacryl group, an acryl group, an isocyanurate group, a ureido group, a sulfide group, an isocyanate group, and mixtures thereof, $G^2$ independently represents $G^1$ or $CH_3$, $0 \leq m \leq 5$, $0 \leq m' \leq 5$, $6 \leq n \leq 1000$, and $1/1000 < $ (the number of $G^1/n$) $\leq 1$;

stirring and aging this mixture; and performing a hydrothermal treatment on the mixture.

* * * * *